United States Patent
Niu et al.

(10) Patent No.: US 10,929,026 B2
(45) Date of Patent: Feb. 23, 2021

(54) MULTI-CELL STRUCTURE FOR NON-VOLATILE RESISTIVE MEMORY

(71) Applicant: Samsung Electronics Co., Ltd., Suwon-si (KR)

(72) Inventors: Dimin Niu, Sunnyvale, CA (US); Mu-Tien Chang, San Jose, CA (US); Hongzhong Zheng, Sunnyvale, CA (US)

(73) Assignee: SAMSUNG ELECTRONICS CO., LTD.

( * ) Notice: Subject to any disclaimer, the term of this patent is extended or adjusted under 35 U.S.C. 154(b) by 232 days.

(21) Appl. No.: 15/136,872

(22) Filed: Apr. 22, 2016

(65) Prior Publication Data

US 2017/0242595 A1 Aug. 24, 2017

Related U.S. Application Data

(60) Provisional application No. 62/298,984, filed on Feb. 23, 2016.

(51) Int. Cl.
*G06F 12/1009* (2016.01)
*G06F 12/02* (2006.01)
(Continued)

(52) U.S. Cl.
CPC .......... *G06F 3/0613* (2013.01); *G06F 3/0625* (2013.01); *G06F 3/0659* (2013.01);
(Continued)

(58) Field of Classification Search
CPC .... G06F 3/0614; G06F 3/0619; G06F 3/0625; G06F 3/0613; G06F 12/0246;
(Continued)

(56) References Cited

U.S. PATENT DOCUMENTS 5,067,111 A * 11/1991 Asano .................. G06F 11/183
                                                             365/185.13
6,047,352 A * 4/2000 Lakhani ............... G11C 7/1045
                                                             365/185.11
(Continued)

FOREIGN PATENT DOCUMENTS

JP 2001043691 A * 7/2001

OTHER PUBLICATIONS

Mederios-Ribeiro, Gilberto, et al., "Lognormal switching times for titanium dioxide bipolar memristors: origin and resolution," IOP Publishing, Nanotechnology 22 (2011), Published Jan. 24, 2011, 5 pages.

*Primary Examiner* — Christopher D Birkhimer
(74) *Attorney, Agent, or Firm* — Renaissance IP Law Group LLP (57) ABSTRACT

A non-volatile memory comprises an array of a plurality of non-volatile memory cells, a controller coupled to the array, and an evaluator coupled to an output of the array. In a first operational mode, the controller receives a logical address and selects one non-volatile memory cell for access. In a second operational mode, and the controller receives a logical address and selects N non-volatile memory cells for access in which N is an integer greater than 1. If the logical address is for a read access, in the first operational mode the evaluator is disabled and the read-address output of the array corresponds to one selected non-volatile memory cell, and in the second operational mode the evaluator determines an read-address output corresponding to the received logical address based on a read output of the N selected non-volatile memory cells.

27 Claims, 4 Drawing Sheets

(51) Int. Cl.
*G06F 3/06* (2006.01)
*G11C 13/00* (2006.01)
*G11C 8/06* (2006.01)

(52) U.S. Cl.
CPC ........ *G06F 3/0685* (2013.01); *G06F 12/0246* (2013.01); *G06F 12/1009* (2013.01); *G11C 8/06* (2013.01); *G11C 13/0002* (2013.01); *G11C 13/004* (2013.01); *G11C 13/0007* (2013.01); *G11C 13/0023* (2013.01); *G11C 13/0061* (2013.01); *G11C 13/0069* (2013.01); *G06F 2212/1024* (2013.01); *G06F 2212/1028* (2013.01); *Y02D 10/00* (2018.01)

(58) Field of Classification Search
CPC .. G06F 3/0659; G06F 3/0685; G06F 12/1009; G06F 2212/1024; G06F 2212/1028; G11C 8/06; G11C 13/0002; G11C 13/0007; G11C 13/0061; G11C 13/0023; G11C 13/004; G11C 13/0069; Y02D 10/13
See application file for complete search history.

(56) References Cited

U.S. PATENT DOCUMENTS

| | | | |
|---|---|---|---|
| 8,183,565 B2 | 5/2012 | Parkinson | |
| 8,400,822 B2 | 3/2013 | Rao et al. | |
| 8,873,309 B2 | 10/2014 | Sutardja et al. | |
| 9,064,569 B1 | 6/2015 | Gorobets et al. | |
| 2006/0133186 A1* | 6/2006 | Hummler | G11C 7/1018 365/230.06 |
| 2008/0183955 A1* | 7/2008 | Yang | G06F 12/0246 711/103 |
| 2010/0131806 A1* | 5/2010 | Weingarten | G06F 11/1072 714/54 |
| 2011/0182104 A1* | 7/2011 | Kim | G11C 11/5685 365/148 |
| 2014/0056061 A1* | 2/2014 | Khvalkovskiy | H01L 43/02 365/158 |
| 2016/0378169 A1* | 12/2016 | Naeimi | G06F 1/3275 713/323 |

* cited by examiner

MULTI-CELL STRUCTURE FOR NON-VOLATILE RESISTIVE MEMORY

CROSS-REFERENCE TO RELATED APPLICATION

This patent application claims the priority benefit under 35 U.S.C. § 119(e) of U.S. Provisional Patent Application No. 62/298,984 filed on Feb. 23, 2016, the disclosure of which is incorporated herein by reference in its entirety.

TECHNICAL FIELD

The present disclosure relates to non-volatile memories. More particularly, the present disclosure relates resistive random access memory (ReRAM) devices.

BACKGROUND

Resistive memory, such as ReRAM and memristors, shows great potential as a future non-volatile memory technology because resistive memory provides high endurance characteristics, has high density, has 3D-stacking capability, has cross-point architecture, requires no refresh overhead (as is necessary with dynamic random access memory (DRAM)), and has no resistance-drift problem as experienced with phase-change memory (PCM).

Process variability may become a critical issue because aggressive scaling of resistive memory technologies may result in device parameter fluctuations and, consequently, adversely affect the performance and the reliability of resistive memory devices. For example, one device parameter that may be adversely affected by process variability is that ReRAM devices exhibit lognormal switching time behavior, and maintaining cell-level reliability may involve relatively long write latency and relatively high write energy.

SUMMARY

An exemplary embodiment provides a non-volatile memory comprising: an array of non-volatile memory cells; a controller coupled to the array in which the controller is to receive in a first operational mode a read address and to select one non-volatile memory cell for read access, and the controller is to receive in a second operational mode a read address and to select N non-volatile memory cells for read access in which N is an integer greater than 1; and an evaluator coupled to an output of the array in which in the first operational mode the evaluator is to be disabled and the read-address output of the array corresponds to the received address based on the read output of the one selected non-volatile memory cell, and in the second operational mode the evaluator is to determine an read-address output corresponding to the received address based on a read output of the N selected non-volatile memory cells. In one embodiment, the controller may include a mapping table that identifies the N non-volatile memory cells corresponding to the received address signal. In another embodiment, the controller is to further receive in the first operational mode a write address signal and to select one non-volatile memory cell for write access, and the controller is to further receive in the second operational mode a write address signal and to select N non-volatile memory cells for write access.

Another exemplary embodiment provides a non-volatile memory comprising: an array of non-volatile memory cells; and a controller coupled to the array in which the controller comprises a logical address register and a mapping table in which the logical address register is to receive a logical read address and the controller in a first operational mode to control the mapping table is to map the received logical read address to one physical address of a non-volatile memory cell for read access, and the controller in a second operational mode is to control the mapping table to map the received logical read address to N physical addresses of N non-volatile memory cells for read access in which N is an integer greater than 1. In one embodiment, the non-volatile memory may comprise an evaluator coupled to an output of the array of non-volatile memory cells in which in the first operational mode the evaluator is to be disabled and a read output of the array of non-volatile memory cells corresponds to the received logical read address, and in the second operational mode the evaluator is to determine an read output corresponding to the received address signal based on a read output of the N non-volatile memory cells. In one embodiment, the logical address register is to further receive a logical write address, and the controller in the first operational mode is to further control the mapping table to map the received logical write address to one non-volatile memory cell for write access, and the controller in the second operational mode is to control the mapping table to map the received logical write address to N physical addresses of N non-volatile memory cells for write access.

Yet another exemplary embodiment provides a controller for a non-volatile memory comprising: a logical address register to receive a logical read address for an array of non-volatile memory cells; and a mapping table coupled to the logical address register in which the mapping table in a first operational mode is to map the received logical read address to a physical address of one non-volatile memory cell of an array of non-volatile memory cells for read access, and in a second operational mode is to map the received logical read address to N physical addresses of N non-volatile memory cells of the array of non-volatile memory cells for read access in which N is an integer greater than 1. In one embodiment, the logical address register is to further receive a logical write address, and in the first operational mode the mapping table is to further map the received logical write address to one non-volatile memory cell for write access, and in the second operational mode the mapping table is to further map the received logical write address to N physical addresses of N non-volatile memory cells for write access.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment is included in at least one embodiment disclosed herein. Thus, the appearances of the phrases "in one embodiment" or "in an embodiment" or "according to one embodiment" (or other phrases having similar import) in various places throughout this specification are not necessarily all referring to the same embodiment. As used herein, the word "exemplary" means "serving as an example, instance, or illustration." Any embodiment described herein as "exemplary" is not to be construed as necessarily preferred or advantageous over other embodiments. Furthermore, the particular features, structures, or characteristics may be combined in any suitable manner in one or more embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Embodiments disclosed herein provide a multi-cell, non-volatile resistive memory structure that is capable of selectively providing a high memory capacity (size) or, alternatively, a high memory-cell reliability. That is, embodiments provide a multi-cell, non-volatile resistive memory comprising a first operation mode that provides an increased memory capacity and a second operating mode that provides an increased memory-cell reliability. It should be understood that although the overall physical memory size of a non-volatile resistive memory array may be fixed, the phrases "high memory capacity," "increased memory capacity," and other similar phrases as used herein mean a memory size that may be up to and include the overall physical memory size of the array. In the same vein, the phrase "reduced memory capacity" and other similar phrases as used herein mean a memory size that is less than the overall physical memory size of the array.

Embodiments disclosed herein also include an evaluation mechanism that is disabled in the first operational mode and is enabled in the second operational mode. If evaluation mechanism is disabled, read accesses to the multi-cell, non-volatile resistive memory are based on accessing a single physical memory address. If the evaluation mechanism is enabled, read accesses to the multi-cell, non-volatile resistive memory are based on accessing N physical memory addresses in which N is an integer greater than 1. Thus, embodiments disclosed herein provide a non-volatile resistive memory having a selectable operational mode that provides either a higher-speed, higher energy-consumption mode with a reduced memory capacity or, alternatively, a slower-speed, higher memory-cell reliability mode with an increased memory capacity.

Figure 1:
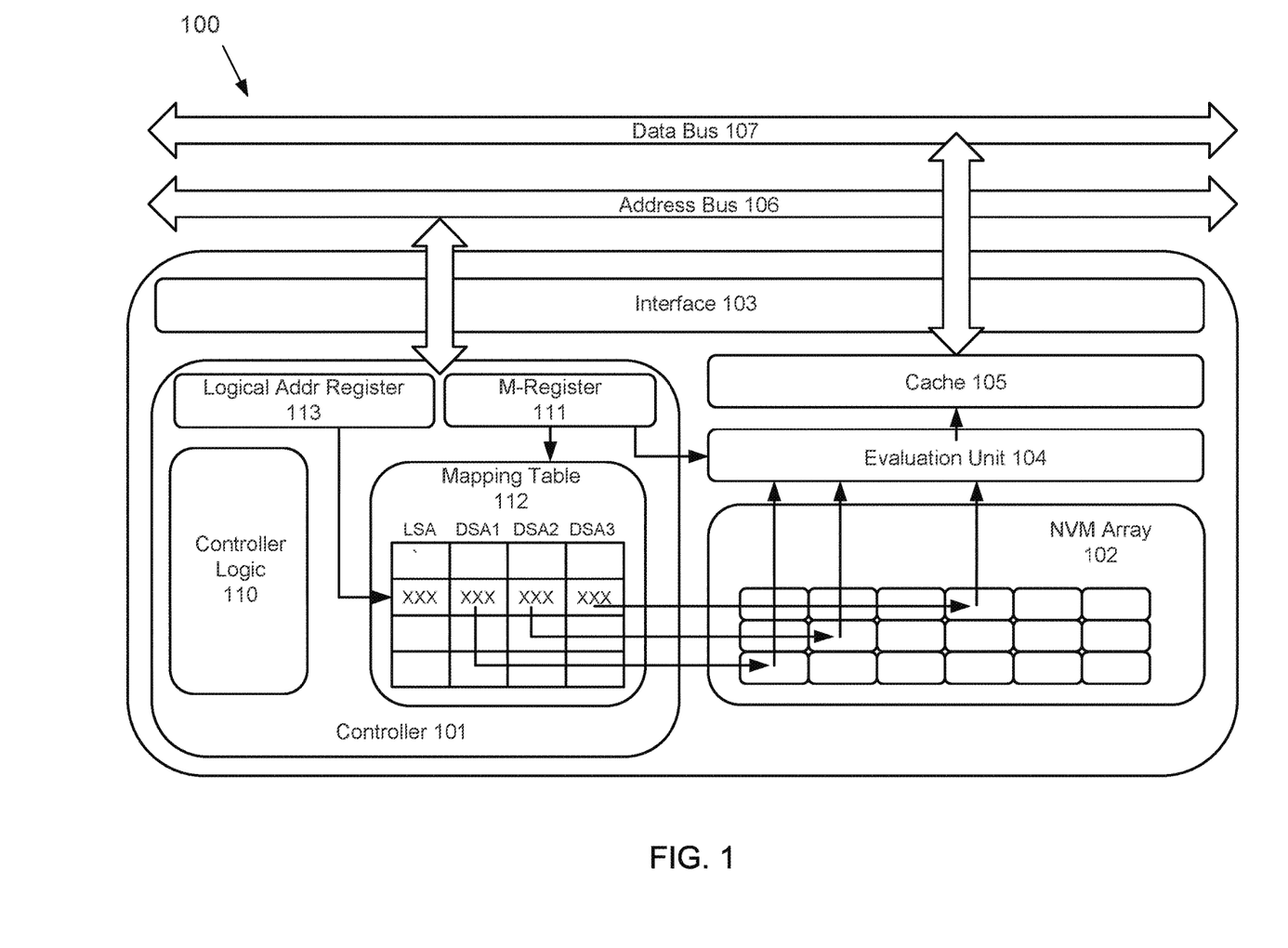
FIG. 1 depicts an example functional block diagram of a multi-cell resistive memory system according to the subject matter disclosed herein.

FIG. 1 depicts an example functional block diagram of a multi-cell resistive memory system 100 according to the subject matter disclosed herein. System 100 includes a controller unit 101, a non-volatile memory array 102, an interface unit 103, an evaluation unit 104, and a cache 105. System 100 may be coupled to an address bus 106 and a data bus 107 of, for example, a host system (not shown), through the interface unit 103. In one embodiment, the non-volatile memory array 102 may comprise an array of resistive memory cells and/or an array of memristors. In one embodiment, system 100 may be embodied as a solid-state drive (SSD). In another embodiment, system 100 may be embodied as a main system memory.

In one embodiment, controller unit 101 may receive address and control data information from the address bus 106 and/or data bus 107. In one embodiment, controller unit 101 may comprise registers (not shown) that are used to set an operational mode by being addressed. In another embodiment, controller unit 101 may comprise registers (not shown) that set an operational mode based on a received address and correspondingly received data. In one embodiment, controller unit 101 may receive control information that is used to control the operational mode of non-volatile memory array 102 and evaluation unit 104.

In one embodiment, the resistive memory cells of the non-volatile memory array 102 may be configured in a well-known arrangement of sectors and/or pages, and may be configured to have a plurality of memory cells organized in a word arrangement of any number of bits (i.e., a multi-bit word). Although the resistive memory cells of the non-volatile memory array 102 may be configured in a well-known arrangement of sectors and/or pages and/or bits, the following description of the subject matter disclosed herein will focus on single memory cells. It should be understood that the subject matter disclosed herein is equally applicable to multi-bit words.

In one embodiment, the non-volatile memory array 102 comprises an array of resistive memory cells that are arranged in one or more rows (not shown) and one or more columns (not shown). As mentioned, in one embodiment, at least one memory cell of array 102 may be a resistive memory cell. In another embodiment, at least one memory cell of array 102 may be a memristor. Memory cells, such resistive memory devices exhibit a lognormal switching-time characteristic, as disclosed by G. Medeiro-Ribeiro et al., Lognormal switching times for titanium dioxide bipolar memristors: origin and resolution, Nanotechnology, IOP Publishing, 22 (2011) 095702. In one embodiment, the non-volatile memory array 102 comprises an array of memory cells that exhibit lognormal switching-time characteristics.

Figure 2:
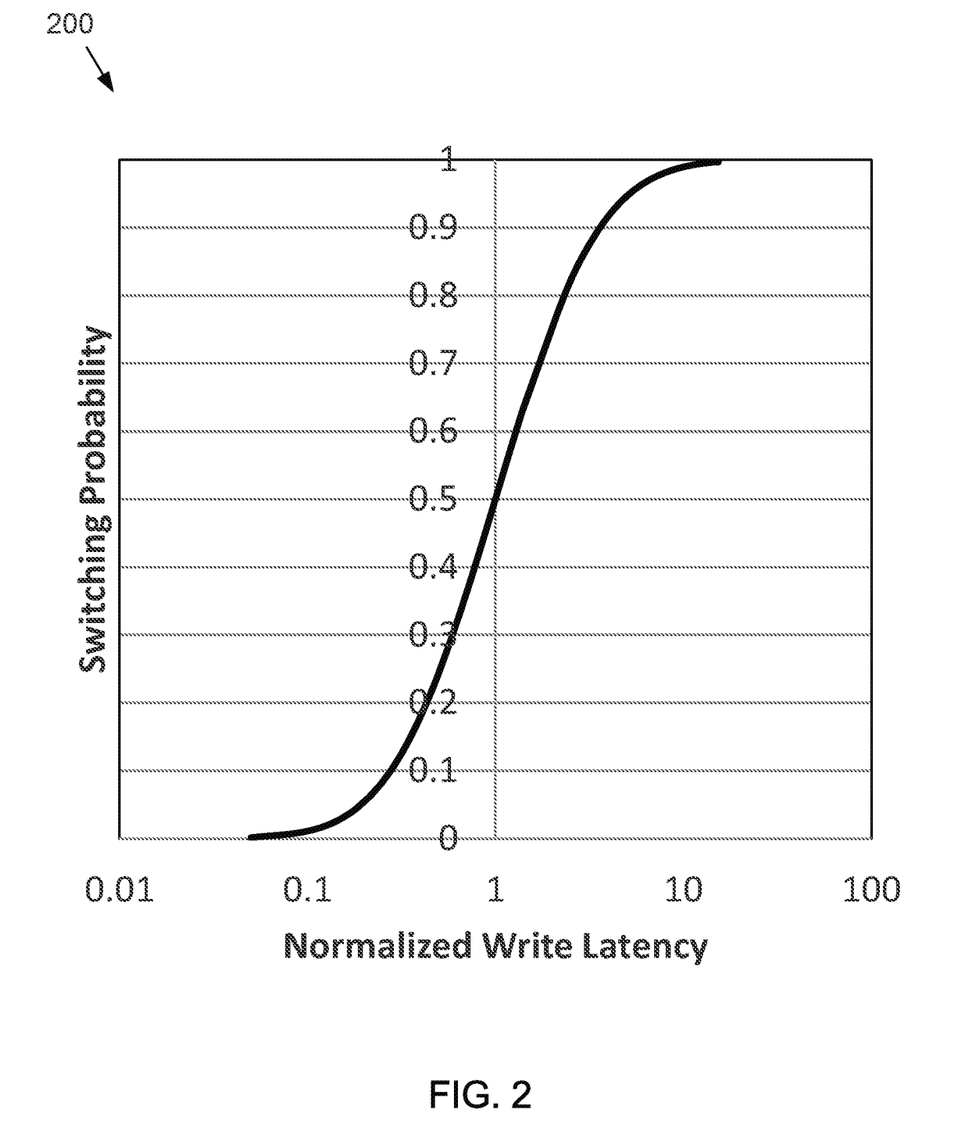
FIG. 2 shows a graph of a switching probability as a function of normalized write latency of the resistive memory cell.

FIG. 2 shows a graph 200 of a switching probability as a function of normalized write latency of the resistive memory cell. FIG. 2 shows the lognormal switching time characteristic of a resistive memory cell. As shown in FIG. 2, to increase the probability that a resistive memory cell will record a write operation, that is, record a change (or a switch) of the datum stored in the resistive memory cell, the write time (and write energy) should correspondingly increase. Conversely, a reduced write latency (and a reduced write energy) corresponds to a decreased switching probability for a resistive memory cell. Table 1 below sets forth some example normalized write latencies for corresponding a BER for a resistive memory cell.

TABLE 1

| Normalized Write Latency (twr) | Bit Error Rate (BER) |
|---|---|
| 403 | $<10^{-9}$ |
| 274 | $<10^{-8}$ |
| 181 | $<10^{-7}$ |
| 116 | $<10^{-6}$ |
| 71 | $<10^{-5}$ |

In one embodiment, system 100 may be configured to utilize the lognormal write latency characteristic of a resistive memory cell to provide a multi-cell, non-volatile resistive memory that is capable of selectively providing a desired memory capacity (size), or a desired level of memory-cell reliability (i.e., a desired BER). In another embodiment, system 100 may be configured to utilize the lognormal write latency characteristics of a resistive memory cell to provide a multi-cell, non-volatile resistive memory that is capable of providing a desired low write latency or, a desired lower memory capacity.

Returning to FIG. 1, the controller unit 101 may include a controller logic 110, a mode register 111, a mapping table 112 and a logical address register 113. The mode register 111 may receive control information that sets either a first operational mode or a second operational mode. The first operational mode may provide an increased memory capacity (size), whereas the second operating mode may provide an increased memory-cell reliability and/or a decreased write latency. The mapping table 112 may include a plurality of entries for logical addresses that are used by the system 100, and a plurality of entries for physical addresses of the non-volatile memory array 102 that correspond to logical addresses. The logical address register 113 may receive a logical address that is input to the mapping table 112. The mapping table may output one or more physical addresses that corresponds to the logical address output from the logical address register.

In the first operational mode, the mapping table 112 may be configured to associate a single logical address to a single physical address, that is, a one-to-one logical-to-physical address association. Additionally, the evaluation unit 104 may be disabled, or bypassed. A single logical address may be mapped to a single physical address in the non-volatile memory array 102 through row and column selectors (not shown). Although mapping table 112 is depicted in FIG. 1 as mapping a single logical address into multiple physical addresses, it should be understood that in the first operating mode a single logical address (LSA) is mapped into only one physical address (DSA1 or DSA2 or DSA3). The datum stored in the memory cell at the physical address corresponding to a received logical address is output and stored in cache 105, which may be dynamic random access memory or static random access memory, for subsequent output to the data bus 107.

In the second operational mode, the mapping table 112 may be configured to associate a single logical address to a plurality of physical addresses, that is, a one-to-many logical-to-physical address association. In the second operational mode, the evaluation unit 104 may be enabled. A single logical address may be mapped to multiple physical addresses in the non-volatile memory array 102. As depicted in FIG. 1, the mapping table 112 maps a single logical address (LSA) into multiple physical addresses (DSA1, DSA1 and DSA3), The outputs of the memory cells at the multiple physical addresses corresponding to a received logical address are evaluated by the evaluation unit 104. The output of the evaluation unit 104 is stored in cache 105 for subsequent output to the data bus 107.

The evaluation unit 104 outputs a value that corresponds to the combined outputs of the memory cells corresponding to the multiple physical addresses. In one embodiment, the evaluation unit 104 may generate an output based on a well-known voting-evaluation technique. In another embodiment, the evaluation unit 104 may generate an output based a majority-detection technique, that is, the output of the evaluation unit 104 is based on the outputs of the multiple memory cells that is in the majority.

The number of physical addresses that a logical address is mapped into in the second operational mode may be a function of a desired level of memory-cell reliability for the non-volatile memory array 102 (i.e., an observed BER for the non-volatile memory array 102). According to the subject matter disclosed herein, multiple resistive memory cells of the non-volatile memory array 102 could be simultaneously written at a lower write latency (and correspondingly lower energy level) to store the same datum. For example, consider a resistive memory array in which the desired bit error rate (BER) is $10^{-9}$ for the array. To achieve this level of BER, the normalized write latency for a single resistive memory cell may be approximately 403. If three resistive memory cells are used to simultaneously store the same datum at the same BER of $10^{-9}$, the normalized write latency may be reduced to approximately 62. A normalized write latency of 62 may result in a BER of $1.8 \times 10^{-5}$ on an individual memory cell basis, but because three memory cells are storing the same datum, the overall BER is improved to $10^{-9}$ (that is, the observed BER of $10^{-9}$).

In one embodiment, a rough estimate of the energy savings for the example of using three resistive memory cells to achieve a BER of $10^{-9}$ for a normalized write latency of 62 is that about three times (3×) less energy is used than using a single memory cell to achieve a BER of $10^{-9}$ for a normalized write latency of 403. More specifically, $$E = VIt, \qquad (1)$$

in which E is the energy in Joules, V is the voltage in Volts, I is the current in Amperes, and t is the time in seconds. If the voltage V and the current I are considered to be fixed, the write latency for a single memory cell has been reduced about a factor of 6, but because three memory cells are being used, the energy is reduced by about a factor of 2.

In one embodiment, the mode register 111 may be configured to generally select N memory cells in which N is an integer greater than 1. The mapping table would be similarly configured to associate a single logical address to N of physical addresses, that is, a 1-to-N logical-to-physical address association, and the evaluation unit 104 would be configured to evaluate the outputs of N memory cells.

Thus, in the second operational mode, the write latency (and corresponding write energy) may be reduced while still maintaining a relatively high BER on an individual resistive memory cell basis. The reduced write latency is obtained by trading memory capacity for the reduced write latency. The observed BER may be further increased (or improved) with correspondingly reduced write latency by using additional memory cells to store the same datum, but by correspondingly decreasing the memory capacity of the non-volatile memory array.

Figure 3:
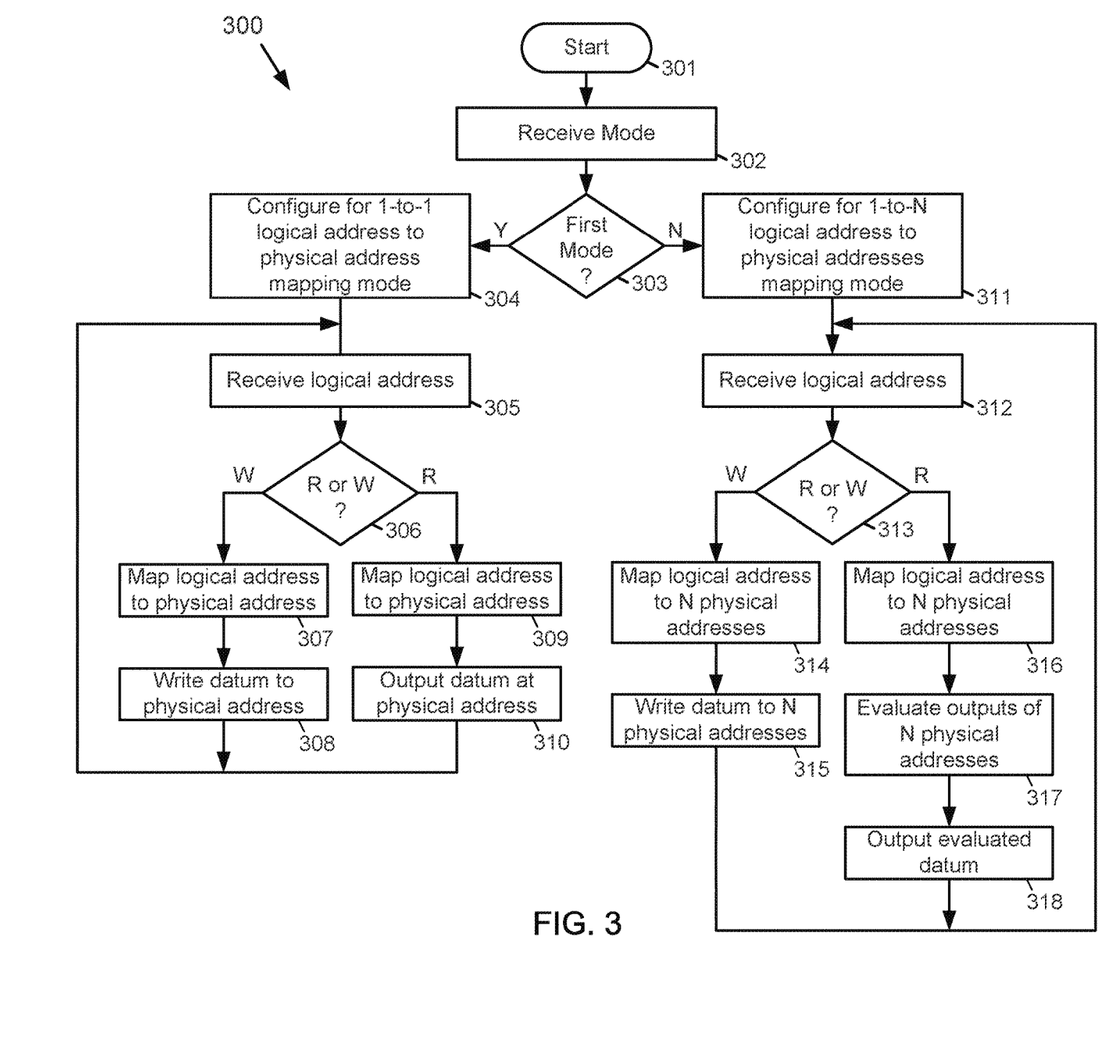
FIG. 3 depicts a flow diagram of a process of configuring and operating a multi-cell resistive system, such as the multi-cell resistive memory system of FIG. 1, in accordance with the subject matter disclosed herein.

FIG. 3 depicts a flow diagram 300 of a process of configuring and operating a multi-cell resistive system, such as the multi-cell resistive memory system 100 of FIG. 1, in accordance with the subject matter disclosed herein. Referring to FIGS. 1 and 3, at operation 301, the process starts during an initialization mode of the multi-cell resistive memory system, such as when the multi-cell resistive memory system is being formated. In one embodiment, the multi-cell resistive memory system 100 can only change the operational mode during a formatting operation and cannot change the operational mode during runtime. If the non-volatile memory array 102 is reformated, flow would begin again at operation 301. At operation 302, the particular mode of operation is received by the mode register 111. At operation 303, it is determined in a well-known manner whether the received mode of operation is the first operational mode or the second operational mode.

If, at operation 303, the received mode of operation is determined to be the first operational mode, flow continues to operation 304 where the mode register 111 configures the mapping table 112 to associate a single logical address to a single physical address (1-to-1) and the evaluation unit 104 is disabled, or bypassed. In one embodiment, the controller logic 110 reads the mode register 111 and based on the contents of the mode register 111, configures the mapping table 112 to associate a single logical address to a single physical address (1-to-1) and the evaluation unit 104 is disabled, or bypassed. In another embodiment, the mode register 111 includes one or more outputs that configure the mapping table 112 to associate a single logical address to a single physical address (1-to-1) and the evaluation unit 104 is disabled, or bypassed. At operation 305, a logical address is received by the logical address register 113. At operation 306, it is determined in a well-known manner whether the received logical address is for a read access or a write access. If the received logical address is determined to be for a write access, the mapping table 112 maps logical address to a physical address at operation 307, and at operation 308, the datum is written to the physical address. Flow returns to operation 305. If, at operation 306, it is determined that the received logical addresss is determined to be for a read access, the mapping table 112 maps the logical address to a physical address at operation 309, and at operation 310, the datum associated with the accessed physical address is output to the cache 105. Flow returns to operation 305. mapping table 112 maps the logical address to a physical address, and the physical address is accessed.

If, at operation 303, the received mode of operation is determined to be the second operational mode, flow continues to operation 311 where the mode register 111 configures the mapping table 112 to associate a single logical address to a plurality of physical addresses (1-to-N in which N is an integer greater than 1) and the evaluation unit 104 is enabled. In one embodiment, the controller logic 110 reads the mode register 111 and based on the contents of the mode register 111, configures the mapping table 112 to associate a single logical address to a N physical addresses (1-to-N) and the evaluation unit 104 is enabled. In another embodiment, the mode register 111 includes one or more outputs that configure the mapping table 112 to associate a single logical address to a N physical address (1-to-N) and the evaluation unit 104 is enabled. At operation 312, a logical address is received by the logical address register 113. At operation 313, it is determined in a well-known manner whether the received logical address is for a read access or a write access. If the received logical address is determined to be for a write access, the mapping table 112 maps logical address to N physical addresses at operation 314, and at operation 315, the datum is written to the N physical addresses. Flow returns to operation 312. If, at operation 313, it is determined that the received logical address is determined to be for a read access, the mapping table 112 maps the logical address to N physical addresses at operation 316. At operation 317, the evaluation unit 104 evaluates the outputs of the accessed N physical addresses. At operation 318317, the evaluation unit 104 outputs the evaluated output to the cache 105. Flow returns to operation 312.

Figure 4:
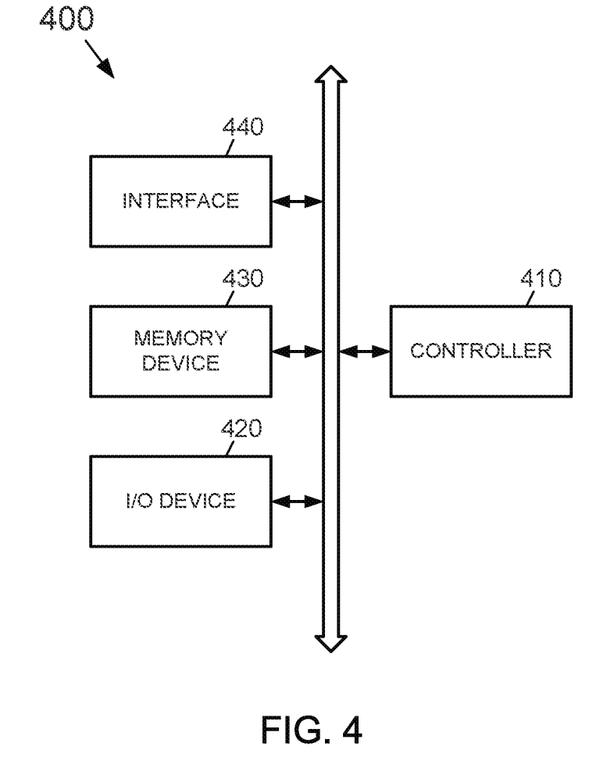
FIG. 4 depicts an electronic device that includes a multi-cell resistive system according to the subject matter disclosed herein.

FIG. 4 depicts an electronic device 400 that includes a multi-cell resistive system according to the subject matter disclosed herein. Electronic device 400 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 400 may comprise a controller 410, an input/output device 420 such as, but not limited to, a keypad, a keyboard, a display, or a touch-screen display, a memory 430, and a wireless interface 440 that are coupled to each other through a bus 450. In one embodiment, the input/output device 420 may include a multi-cell non-volatile resistive memory system according to the subject matter disclosed herein. In one embodiment, memory 430 may include a multi-cell non-volatile resistive memory system according to the subject matter disclosed herein. The controller 410 may comprise, for example, at least one microprocessor, at least one digital signal process, at least one microcontroller, or the like. The memory 430 may be configured to store a command code to be used by the controller 410 or a user data. The electronic device 400 may use a wireless interface 440 configured to transmit data to or receive data from a wireless communication network using a RF signal. The wireless interface 440 may include, for example, an antenna, a wireless transceiver and so on. The electronic system 400 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 5:
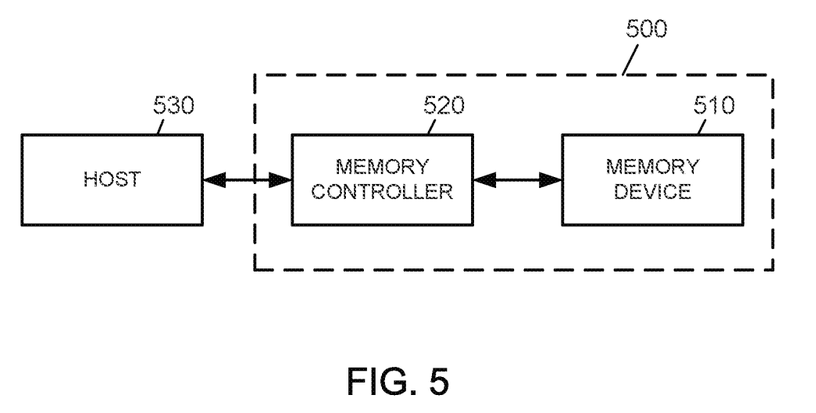
FIG. 5 depicts a memory system that may comprise a multi-cell resistive memory system according to the subject matter disclosed herein.

FIG. 5 depicts a memory system 500 that may comprise a multi-cell resistive memory system according to the subject matter disclosed herein. The memory system 500 may comprise a memory device 510 for storing large amounts of data and a memory controller 520. In one embodiment, the memory device 510 may comprise an array of resistive memory cells. The memory controller 520 controls the memory device 510 to read data stored in the memory device 510 or to write data into the memory device 510 in response to a read/write request of a host 530. The memory controller 520 may include an address-mapping table for mapping a logical address provided from the host 520 (e.g., a mobile device or a computer system) into one or more physical addresses of the memory device 510 according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A non-volatile memory, comprising:
    an array of non-volatile memory cells, the array comprising an output, and each non-volatile memory cell of the array to store a value;
    a controller coupled to the array, the controller utilizing a mapping table containing information that identifies one or more non-volatile memory cells corresponding to a read address, the controller to receive in a first operational mode a first read address and in response selects one non-volatile memory cell for read access, and the controller to receive in a second operational mode a second read address and in response selects N non-volatile memory cells for read access in which N is an integer greater than 1 and in which N is selectable based on a desired level of a bit error rate of data read at the second read address; and
    an evaluator coupled to the output of the array, in the first operational mode the evaluator is unused and the output of the array is the value of the one non-volatile memory cell selected in response to the first read address, and in the second operational mode, the evaluator is used to determine the output of the array to be a combined value of the N non-volatile memory cells selected in response to the second read address, the combined value being based on a voting-evaluation technique or based on a majority-detection technique;
    wherein the controller is to further receive in the first operational mode a first write address and in response select one non-volatile memory cell for write access, and the controller is to further receive in the second operational mode a second write address and in response select N non-volatile memory cells for write access; and
    wherein, in the first operational mode the controller is to write the one non-volatile memory cell for a first write time using a first write energy to achieve the desired level of the bit error rate, in the second operational mode the controller is to write the N non-volatile memory cells for a second write time using a second write energy to achieve the desired level of the bit error rate, the second write time is shorter than the first write time, and the second write energy is lower than the first write energy.

2. The non-volatile memory according to claim 1, wherein an array of non-volatile memory cells comprises an array of resistive memory cells.

3. The non-volatile memory according to claim 2, wherein at least one resistive memory cell comprises a resistive random access memory (ReRAM) cell.

4. The non-volatile memory according to claim 2, wherein at least one resistive memory cell comprises a memristor.

5. The non-volatile memory according to claim 1, wherein the non-volatile memory comprises a solid-state drive (SSD) or a main memory.

6. The non-volatile memory according to claim 1, wherein the first operational mode comprises a slow, high-power mode.

7. The non-volatile memory according to claim 1, wherein the second operational mode comprises a fast, low-power mode.

8. The non-volatile memory according to claim 1, wherein N=3.

9. The non-volatile memory according to claim 1, wherein:
    the first write time causes the one non-volatile memory cell selected in response to the first read address to have a bit error rate;
    the second write time causes the combined value of the N non-volatile memory cells selected in response to the second read address to have a combined bit error rate; and
    the bit error rate of the one non-volatile memory cell is substantially equal to the combined bit error rate of the N non-volatile memory cells.

10. A non-volatile memory, comprising:
    an array of non-volatile memory cells, the array comprising an output, and each non-volatile memory cell of the array to store a value;
    a controller coupled to the array, the controller comprising a logical address register and utilizing a mapping table, the logical address register to receive a logical read address and the mapping table containing information that identifies one or more non-volatile memory cells corresponding to the logical read address, the controller in a first operational mode to utilize the mapping table to map the logical read address to one physical address of a non-volatile memory cell for read access, and the controller in a second operational mode to utilize the mapping table to map the logical read address to N physical addresses of N non-volatile memory cells for read access in which N is an integer greater than 1 and in which N is selectable based on a desired level of a bit error rate of data read at the logical read address in the second operational mode; and
    an evaluator coupled to the output of the array, in the first operational mode the evaluator is unused and the output of the array is the value of the one physical address of the non-volatile memory cell mapped in response to the logical read address, and in the second operational mode the evaluator is used to determine the output of the array to be a combined value of the N physical addresses of the N non-volatile memory cells mapped in response to the logical read address, the combined value being based on a voting-evaluation technique or based on a majority-detection technique;
    wherein the logical address register is to further receive a logical write address;
    wherein the controller in the first operational mode is to further utilize the mapping table to map the logical write address to one physical address of a non-volatile memory cell for write access, and the controller in the second operational mode is to utilize the mapping table to map the logical write address to N physical addresses of N non-volatile memory cells for write access, and wherein, in the first operational mode the controller is to write the non-volatile memory cell at the one physical address for a first write time using a first write energy to achieve the desired level of the bit error rate, in the second operational mode the controller is to write the N non-volatile memory cells at the N physical addresses for a second write time using a second write energy to achieve the desired level of the bit error rate, the second write time is shorter than the first write time, and the second write energy is lower than the first write energy.

11. The non-volatile memory according to claim 10 wherein at least one non-volatile memory cell comprises a resistive random access memory (ReRAM) cell or a memristor.

12. The non-volatile memory according to claim 10, wherein the non-volatile memory comprises a solid-state drive (SSD) or a main memory.

13. The non-volatile memory according to claim 10, wherein the first operational mode comprises a slow, high-power mode, and wherein the second operational mode comprises a fast, low-power mode.

14. The non-volatile memory according to claim 10, wherein N=3.

15. The non-volatile memory according to claim 10, wherein:

the first write time causes the one non-volatile memory cell at the one physical address to have a bit error rate;

the second write time causes the combined value of the N non-volatile memory cells at the N physical addresses to have a combined bit error rate; and the bit error rate of the one non-volatile memory cell is substantially equal to the combined bit error rate of the N non-volatile memory cells.

16. A controller for a non-volatile memory, comprising:

a logical address register to receive a logical read address for an array of non-volatile memory cells, the array comprising an output, and each non-volatile memory cell of the array to store a value; and a mapping table coupled to the logical address register, the mapping table containing information that identifies one or more non-volatile memory cells corresponding to a logical read address, the mapping table in a first operational mode to map the logical read address to a physical address of one non-volatile memory cell of the array of non-volatile memory cells for read access to output the value of the one non-volatile memory cell, and in a second operational mode to map the logical read address to N physical addresses of N non-volatile memory cells of the array of non-volatile memory cells for read access to output a combined value of the N non-volatile memory cells in which N is an integer greater than 1 and in which N is selectable based on a desired level of a bit error rate of data read at the logical read address in the second operational mode, the combined value being based on a voting-evaluation technique or based on a majority-detection technique;

wherein the logical address register is to further receive a logical write address;

wherein in the first operational mode the mapping table is to further map the logical write address to a physical address of one non-volatile memory cell for write access, and in the second operational mode the mapping table is to further map the logical write address to N physical addresses of N non-volatile memory cells for write access;

wherein the controller further comprises controller logic to, in the first operational mode, write the one non-volatile memory cell for a first write time using a first write energy to achieve the desired level of the bit error rate, and in the second operational mode, write the N non-volatile memory cells for a second write time using a second write energy to achieve the desired level of the bit error rate;

wherein the second write time is shorter than the first write time; and wherein the second write energy is lower than the first write energy.

17. The controller according to claim 16, wherein N=3.

18. The controller according to claim 16, wherein the array of non-volatile memory cells comprises at least one resistive random access memory (ReRAM) cell or at least one memristor.

19. The non-volatile memory according to claim 16, wherein:

the first write time causes the one non-volatile memory cell to have a bit error rate;

the second write time causes the combined value of the N non-volatile memory cells to have a combined bit error rate; and the bit error rate of the one non-volatile memory cell is substantially equal to the combined bit error rate of the N non-volatile memory cells.

20. A non-volatile memory, comprising:

an array of resistive memory cells, the array comprising an output, and each resistive memory cell of the array to store a value;

a controller coupled to the array, the controller to receive in a first operational mode a first read address and in response selects one resistive memory cell for read access, and the controller to receive in a second operational mode a second read address and in response selects N resistive memory cells for read access in which N is an integer greater than 1 and in which N is selectable based on a desired level of a bit error rate of data read at the second read address; and an evaluator coupled to the output of the array, in the first operational mode the evaluator is unused and the output of the array is the value of the one resistive memory cell selected in response to the first read, and in the second operational mode, the evaluator is used to determine the output of the array to be a combined value of the N resistive memory cells selected in response to the second read address, the combined value being based on a voting-evaluation technique or based on a majority-detection technique;

wherein the controller utilizes a mapping table that identifies the N resistive memory cells selected in response to the second read address;

wherein the controller is to further receive in the first operational mode a first write address and in response selects one resistive memory cell for write access, and the controller is to further receive in the second operational mode a second write address and in response selects N resistive memory cells for write access; and wherein, in the first operational mode the controller is to write the one resistive memory cell for a first write time using a first write energy to achieve the desired level of the bit error rate, in the second operational mode the controller is to write the N resistive memory cells for a second write time using a second write energy to achieve the desired level of the bit error rate, the second write time is shorter than the first write time, and the second write energy is lower than the first write energy.

21. The non-volatile memory according to claim 20, wherein at least one resistive memory cell comprises a resistive random access memory (ReRAM) cell.

22. The non-volatile memory according to claim 20, wherein at least resistive memory cell comprises a memristor.

23. The non-volatile memory according to claim 20, wherein the non-volatile memory comprises a solid-state drive (SSD) or a main memory.

24. The non-volatile memory according to claim 20, wherein the first operational mode comprises a slow, high-power mode.

25. The non-volatile memory according to claim 20, wherein the second operational mode comprises a fast, low-power mode.

26. The non-volatile memory according to claim 20, wherein N=3.

27. The non-volatile memory according to claim 20, wherein:
- the first write time causes the one resistive memory cell to have a bit error rate;
- the second write time causes the combined value of the N resistive memory cells to have a combined bit error rate; and
- the bit error rate of the one resistive memory cell is substantially equal to the combined bit error rate of the N resistive memory cells.

* * * * *